Dec. 25, 1951 P. M. BRANNEN 2,580,155

PROXIMITY DETECTOR EMPLOYING MICROWAVES

Filed June 4, 1949

INVENTOR.
Paul M. Brannen.
BY
W. L. Stout.
HIS ATTORNEY

Patented Dec. 25, 1951 2,580,155

UNITED STATES PATENT OFFICE 2,580,155

PROXIMITY DETECTOR EMPLOYING MICROWAVES

Paul M. Brannen, Duquesne, Pa., assignor to Westinghouse Air Brake Company, a corporation of Pennsylvania Application June 4, 1949, Serial No. 97,107

4 Claims. (Cl. 177—352)

Figure 1:
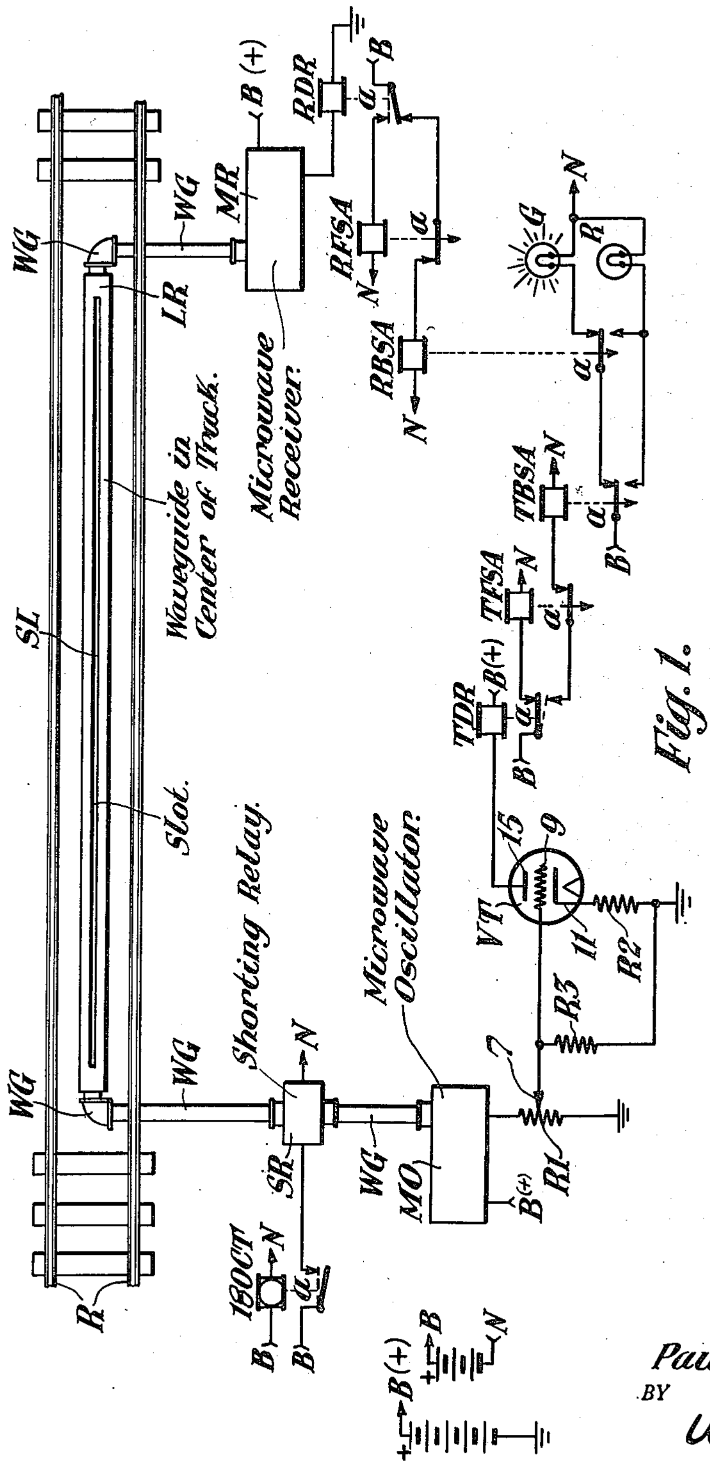

My invention relates to proximity detectors, and particularly to a proximity detector employing microwave energy radiated in a linear pattern throughout the space to be protected against intrusion.

It has heretofore been proposed to provide proximity or intrusion detection systems employing electromagnetic fields or electrostatic fields by providing a configuration of wires or cables energized by a suitable source so that an electromagnetic or electrostatic field is created in the space to be protected. Variations in the field caused by the intrusion or proximity of a foreign object result in a change of the inductance or capacitance of the wire network, which in turn affects the source of energy, and suitable means are provided for detecting such changes to thereby indicate the proximity or intrusion of an object in the protected space.

Such systems are somewhat limited in that the space to be protected is determined by the configuration of wires or cables employed, and such networks are of necessity exposed to mechanical abuse and damage.

It is therefore an object of my invention to provide an improved proximity detector system employing microwave energy which requires only a single element of sturdy construction disposed within the area to be protected.

Another object of my invention is to provide an improved proximity detector system employing microwave energy and having a linear radiator for the microwave energy disposed within the area to be protected.

A further object of my invention is to provide an improved proximity detector system employing microwave energy, which system is arranged to operate on the closed circuit principle, so that any failures of the system or associated apparatus are on the side of safety.

Another object of my invention is to provide a microwave proximity detector system employing a linear radiator which may be adapted to various spaces to be protected.

A further object of my invention is to provide a microwave proximity detector system in which changes in the amount of power required by the system as a result of the intrusion of an object are utilized to detect the presence of the object.

Still another object of my invention is to provide a microwave proximity detector system of the type described which is recurrently artificially loaded, and the recurrent changes in the power required as a result of the loading are detected to provide a system operating on a "closed circuit principle."

A further object of my invention is to provide a microwave proximity detector system in which the continuity of the linear radiator is continuously checked.

Another object of my invention is to provide an improved microwave proximity detector system.

Other objects of my invention and features of novelty therein will be apparent from the following description taken in connection with the accompanying drawings.

I shall describe one form of microwave proximity detector system embodying my invention and shall then point out the novel features thereof in claims.

In practicing my invention, I provide a microwave oscillator, the output of which is supplied to a linear radiator, such as a slotted wave guide, or a coaxial line equipped with a plurality of antennas, which linear radiator is co-extensive with the area to be protected and is arranged so that the microwave energy supplied thereto from the microwave oscillator is radiated in a pattern such that the microwave energy is radiated into the space to be protected. The oscillator operates continuously and with no foreign object present in the field of the linear radiator, a predetermined amount of power is dissipated in the protected space. When a foreign object enters the field of the linear radiator, the absorption or the re-radiation of the microwave energy by the object, or both, cause an increase in the amount of power dissipated. This change in power is detected by a suitable means to thereby indicate the intrusion of the object. In order to render the system less liable to foreign energy interference, and to place the system on a safe operating basis, the system is recurrently artificially loaded at a certain rate, and the response of the system to the recurrent loading is detected. Thus if the system becomes deranged in such manner that the power changes can no longer be detected, the detecting means will provide the same indication as that produced by the intrusion of a foreign object, so that all failures are on the side of safety.

Figure 2:
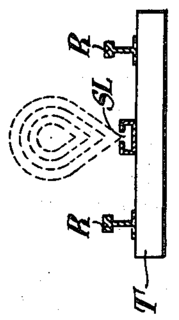

In the drawings, Fig. 1 shows in diagrammatic form, a preferred arrangement of apparatus embodying my invention for detecting the presence of a train in a section of railway track, and Fig. 2 shows a pattern in which microwave energy may be radiated by the slotted wave guide of Fig. 1.

Similar reference characters refer to similar parts in each of the two views.

Referring to Fig. 1, there is shown a section of railway track, having the track rails R, in which it is desired to detect the presence of the train, by apparatus embodying my invention. It will be obvious that the arrangement of apparatus embodying my invention may be utilized for the detection of other objects, such as, for example, the presence of airplanes upon a particular stretch of an airport runway.

A linear radiator, that is, means for radiating electromagnetic energy in a pattern which is substantially larger in one dimension than in any other dimension, is provided to radiate microwave energy in a pattern which will extend down the center of the railway track, and as shown in Fig. 1, the linear radiator may comprise a slotted wave guide disposed in the center of the track, having a slot SL in its upper surface, which extends the length of the area to be protected. Although the linear radiator is here shown as a slotted wave guide, it will be obvious to those skilled in the art that other forms of linear radiators may be employed, such as, for example, a coaxial line with suitable antennas provided thereon at spaced intervals, or a wave guide having a plurality of spaced holes therein rather than a continuous slot extending throughout its length. Suitable covering means may be provided for the wave guide, which will prevent snow, ashes or other debris from falling through the slot into the wave guide, but which will permit energy to be radiated from the slot.

The linear radiator or slotted wave guide, is coupled by appropriate sections of wave guide WG to a shorting relay SR and a microwave oscillator MO. The shorting relay SR is constructed and arranged so that when electrical energy is supplied to the coils of the relay, it operates to remove a loading device which is inserted in the wave guide section when the electromagnets associated with the shorting relay are deenergized. That is, at such times as the shorting relay SR is not supplied with energy, an artificial load is placed within the transmission line comprising the wave guide sections WG, and when the shorting relay is energized, the load is removed, so that there is no obstruction to the energy flowing in the transmission line.

Such a shorting relay may be constructed and arranged in a manner similar to the wave guide attenuators shown in chapter 12 of the book entitled "Technique of Microwave Measurements," volume 11, M. I. T. Radiation Laboratory series, published by the McGraw-Hill Book Company. The wave guide attenuators shown in this reference are arranged to be manually operated, but it is obvious that a suitable electromagnet or solenoid could be substituted for the manual control means, to thereby provide a shorting relay suitable for use in my invention. The shorting relay SR is governed by an obvious circuit which includes a front contact *a* of a code transmitter 180CT. The code transmitter 180CT has its operating winding continuously connected across a low voltage source, such as the battery shown, the positive and negative terminals of which are designated as B and N respectively. The 180 code transmitter is constructed and arranged so that with energy continuously supplied to its operating winding, its contacts are recurrently operated 180 times per minute. It is to be understood that the operation of my system is not limited to arrangements wherein 180 code frequency is used, but this serves only as an example, and other frequencies may be used as well. Each time contact *a* of the code transmitter 180CT is closed, energy is supplied from the low voltage battery to energize the shorting relay SR. Accordingly, it will be seen that, in normal operation, the shorting relay operates 180 times per minute to place an artificial load in the wave guide WG and after a short time interval to remove the load.

The microwave oscillator MO may be of any suitable type, and it is believed sufficient for the purposes of this particular disclosure to point out that the microwave oscillator MO is arranged and constructed so that microwave energy of substantially constant power is supplied to the wave guide WG, when energy is supplied to the input of microwave oscillator MO. This energy is supplied from a high voltage source such as the battery shown, the positive terminal of which is designated as B(+), and the negative terminal of which is grounded.

Accordingly, it will be seen that at this time the microwave oscillator MO is in continuous operation, and microwave energy is thus supplied through the wave guide WG to the slotted wave guide in the center of the railway track. During the time that the shorting relay SR is energized, the energy is supplied to the slotted wave guide, and is radiated into space, this radiation imposing a certain load upon the microwave oscillator MO. When the shorting relay SR is deenergized, a certain greater predetermined load is imposed upon the microwave oscillator MO, so that the load imposed on the microwave oscillator MO varies at a rate of 180 times per minute.

The microwave energy supplied to the slotted wave guide is propagated therethrough, and sets up an inductive and a radiated field through the slot in its top surface, so that a field pattern is set up in a manner similar to that shown in Fig. 2, in which a rectangular wave guide is shown disposed between the track rails R and is placed on top of the ties T, the radiated field being shown by dotted lines extending upwardly from the slot in the wave guide.

At the far end of the slotted wave guide, suitable wave guide connections WG are provided to connect the slotted wave guide to a microwave receiver MR. This receiver may be of any suitable type, such as a crystal-video receiver, well known in the radar beacon art. The receiver is supplied with energy from the high voltage source, and it is deemed sufficient to point out that the microwave receiver MR is constructed and arranged in such manner that when microwave energy is supplied thereto from the slotted wave guide in the track by way of the wave guide connections WG, energy is supplied to the winding of a receiver detector relay RDR, in such manner that when microwave energy of a predetermined value is received the contacts of relay RDR are picked up, and when no microwave energy or energy below a predetermined value is supplied to the input of the microwave receiver, the relay RDR is deenergized and its contacts are released. It will be assumed that when the shorting relay SR is deenergized, it cuts off the supply of energy to the slotted wave guide to the track, so that no energy is received by the microwave receiver MR, and as a result the contacts of relay RDR release. When the shorting relay SR is energized, energy is supplied from the microwave oscillator MO to the slotted wave guide, and a portion of the energy travels down the wave guide and is supplied to the microwave receiver MR, so that the contacts of relay RDR are picked up. Since the shorting relay SR is operated 180 times per minute, it follows that the contacts of relay RDR will be operated at the same rate, in response to the periodic supply of microwave energy to the slotted wave guide.

As previously pointed out, the microwave oscillator MO is continuously supplied with energy from the high voltage source. The energy is supplied from the source to the microwave oscillator through a dropping resistor R1, having an adjustable tap 7. The grid 9 of vacuum tube VT is connected to the tap 7, the cathode of the tube being connected to ground and negative side of the high voltage source through a resistor R2, and the plate or anode 15 of the vacuum tube VT being connected to the positive terminal B(+) of the source through the winding of a code-following relay TDR. In order to simplify the drawing, the connections for supplying energy to the heater of tube VT are not shown. The parts are constructed and arranged so that the value of energy which normally flows through the winding of relay TDR and through the anode-cathode circuit of tube VT is insufficient to cause the relay TDR to pick up its contacts. The cathode dropping resistor R2 functions in the usual manner to supply a negative bias voltage through the grid resistor R3, so that the grid 9 of vacuum tube VT is normally at such potential that the vacuum tube VT is not conductive to the point where the plate current is of the value necessary to cause the contacts of relay TDR to become picked up. The grid 9 of vacuum tube VT is supplied with control voltage from the tap 7 of resistor R1, and it will be apparent that the magnitude of the voltage supplied to the grid 9 is proportional to the amount of current which flows through the resistor R1 and the microwave oscillator MO. The parts are constructed and arranged so that the current which normally flows to the microwave oscillator during the time that the oscillator is supplying its normal output power to the wave guide is such that the control voltage supplied to the grid 9 is insufficient to overcome the biasing voltage also applied thereto. When the power output of the microwave oscillator MO is increased due to a load imposed on it, there is a corresponding increase in the power supplied to the oscillator through the resistor R1, so that an increase in the current in resistor R1 causes an increase in the control voltage supplied to the grid 9 of vacuum tube VT. When this voltage increases to a predetermined point, the plate current of the tube attains a value sufficient to cause the contacts of relay TDR to become picked up.

It will be seen therefore, that my invention provides means for detecting the change in the power input to the microwave oscillator MO, which in turn is responsive to changes in the power output of the microwave oscillator. As previously described, when the shorting relay SR is deenergized, the load on the oscillator MO increases, so that more power must be supplied thereto. At this time therefore, the contacts of relay TDR will become picked up. When the shorting relay SR is energized, the load on the microwave oscillator consists only of that imposed by the energy necessary to set up the field produced by the slotted wave guide and the power losses in the wave guide plus the power which is supplied to the microwave receiver at the far end of the wave guide. The power detection portion of the equipment comprising the resistor R1 and the vacuum tube VT with its associated relay TDR and other circuit elements are arranged and constructed so that the value of power taken at this time is sufficient to cause the relay TDR to become picked up.

From the foregoing, it will be seen that with the apparatus in its normal condition, the load on the microwave oscillator MO is recurrently varied between a first value caused by the load imposed on the oscillator by the radiated field of the slotted wave guide, the losses in the wave guide, and the power supplied to the microwave receiver, and a second value imposed on the oscillator as a result of the operation of the shorting relay SR to increase the load on the oscillator. The power detecting means comprising the vacuum tube VT and its associated resistors and the relay TDR is accordingly recurrently operated at the same rate as the shorting relay, namely, 180 times per minute. The energy supplied to the microwave receiver MR is likewise varied recurrently 180 times per minute, so that the receiver detector relay RDR is operated at the same rate. The recurrent operation of the contacts of relays TDR and RDR is detected by suitable means, such as the slow release relays TFSA, TBSA, RFSA, and RBSA, which are governed by contacts *a* of relay TDR and RDR in the well-known FSA-BSA method of code detection employed inthe railway signaling art. For example, when contact *a* of relay TDR is picked up energy is supplied over an obvious circuit to the winding of relay TFSA, which relay is slightly slow in releasing its contacts, so that its contacts remain picked up during short intervals in which relay TDR is released. When relay TDR is released, a circuit is established for supplying energy to the winding of relay TBSA which includes back contact *a* of relay TDR, and front contact *a* of relay TFSA. The relay TBSA is slightly slow in releasing its contacts, so that the contacts of the relay remain picked up during the short intervals in which the contact *a* of relay TDR is in its picked up position. It will be seen, therefore, that when relay TDR operates its contact *a* between its picked up and released position 180 times per minute as previously described, the relays TFSA and TBSA will be energized and their contacts will be picked up. In a similar manner, the relay RDR governs relays TFSA and RBSA, so that when the contact *a* of relay RDR is operating 180 times per minute between its released and picked up positions, the contacts of relays RFSA and RBSA are picked up.

Suitable indication or control circuits may then be governed by contacts of relays TBSA and RBSA, for example, the green indicator light G is shown as controlled by a circuit including front contacts *a* of relays TBSA and RBSA in series, so that at this time with the equipment operating normally and no train standing on the track over the slotted wave guide, the green lamp G will be lighted.

It will now be assumed that a train enters the section of track and moves over the slotted wave guide in the center of the track, so that it intercepts the field set up by the energy radiated from the slot in the wave guide. The microwave energy radiated from the wave guide will be absorbed or re-radiated or both from the under surface of the train, and as a result there will be an increase in the power supplied to the wave guide due to this absorption. The increase in power to the wave guide as a result of the absorption of energy causes an increased load on the microwave oscillator MO during the periods when the shorting relay SR is picked up, and as previously explained the shorting relay SR when released imposes an artificial load on the oscillator, so that the microwave oscillator is substantially continuously loaded at an increased value during this time. As a result, the current through the resistor R1 increases sufficiently to cause the vacuum tube VT to conduct sufficient current to allow the contact *a* of relay TDR to pick up and remain picked up. When contact *a* of relay TDR remains in its picked up position for an interval longer than the release time of relay TBSA, this relay will release. The release of contact *a* of relay TBSA interrupts the supply of energy to the green indication lamp G and a circuit is established over the back contact *a* to supply energy to the red indication lamp R, to thereby denote the occupancy of the section by a train.

At this time the microwave receiver will still receive energy from the wave guide, and relay RDR will continue to operate, maintaining relays RFSA and BFSA energized, and the front contact *a* of relay RBSA remains picked up in the circuit for supplying energy to the green lamp G, but as is obvious from the circuit on the drawing, the supply of energy to the green lamp G is cut off by the contact *a* of relay TBSA and the supply of energy to the red lamp is established by this contact.

When the train moves out of the protected section, so that it no longer absorbs or re-radiates energy from the slotted wave guide in the track, there is no longer a continuous load imposed upon the microwave oscillator MO, of sufficient magnitude to cause the power detection apparatus to function, so that relay TDR releases its contact. However, the shorting relay SR continues to operate, recurrently placing a load on the microwave oscillator, so that the power detection apparatus functions as described originally to cause the recurrent operation of relay TDR so that energy is again supplied to relays TFSA and TBSA and when contact *a* of relay TBSA becomes picked up, it interrupts the supply of energy to the red lamp R and establishes a circuit for supplying energy to the green lamp G, so that the illumination of the green lamp G denotes that the section is no longer occupied.

An important feature of my invention is the fact that any type of derangement of the apparatus will cause a failure on the side of safety, that is to say, the apparatus will operate in the same manner as though a train occupies a section. For example, if the wave guide or any of its connections should become broken, so that microwave energy of suitable value is no longer supplied to the entire stretch of slotted wave guide in the center of the track, insufficient energy will be supplied to the microwave receiver MR, and its relay RDR will release and remain released. Accordingly, the supply of energy to relays RFSA and BFSA is interrupted, and when contact *a* of relay RBSA releases it interrupts the supply of energy to the green lamp G and establishes a circuit for supplying energy to the red lamp R, which is the same indication as is provided when a train occupies the section of protected track. Similarly, if the shorting relay SR should become deranged so that a continuous load is applied to the microwave oscillator MO, relay TDR will pick up and remain picked up, resulting in the release of relay TBSA, which as previously described causes the occupied indication to be displayed by the red lamp R.

In a similar manner, other failures of the apparatus will eventually result in the release of either the relay TBSA or the relay RBSA, or both, so that the green lamp G is extinguished and the red lamp R is illuminated, providing the same indication as occupancy of the section, which is considered as a safe failure.

It will be obvious to those skilled in the art that various modifications may be made in the system, such as, for example, the linear radiator may be a coaxial cable provided with suitable radiators, preferably of the dipole type, spaced at close enough intervals to provide a substantially continuous radiated field above the linear radiator, or, the slotted wave guide may be used in the track with connections to the microwave oscillator, the shorting relay, and the microwave receiver by means of coaxial cable.

Although I have herein shown and described only one form of proximity detector apparatus embodying my invention, it is to be understood that various changes and modifications may be made therein within the scope of the appended claims without departing from the spirit and scope of my invention.

Having thus described my invention, what I claim is:

1. In a system for detecting the intrusion of objects into a protected space, in combination, a linear radiator for electromagnetic energy in the microwave spectrum coextensive with the space to be protected and arranged to radiate electromagnetic energy in a pattern to include said protected space, supply means for supplying microwave energy to said linear radiator at one end thereof, receiver means for receiving a portion of said microwave energy at the other end of said linear radiator, a first detecting means for detecting a change in the value of energy supplied to said linear radiator at said one end, a second detecting means associated with said receiver means for detecting a change in the value of energy received at said other end of the linear radiator, means for recurrently changing the value of energy supplied to said linear radiator, and checking means for detecting the recurrent response of said first and said second detecting means.

2. In a system for detecting the intrusion of objects into a protected space, in combination, a linear radiator for electromagnetic energy in the microwave spectrum coextensive with the space to be protected and arranged to radiate electromagnetic energy in a pattern to include said protected space, said linear radiator comprising a wave guide having at least one aperture therein for radiating said energy, supply means for supplying microwave energy to said linear radiator at one end thereof, receiver means for receiving a portion of said microwave energy at the other end of said linear radiator, a first detecting means for detecting a change in the value of energy at said one end, and a second detecting means associated with said receiver means for detecting a change in the value of energy received at said other end of the linear radiator.

3. In a system for detecting the intrusion of objects into a protected space, in combination, a linear radiator for electromagnetic energy in the microwave spectrum coextensive with the space to be protected and arranged to radiate electromagnetic energy in a pattern to include said protected space, said linear radiator comprising a wave guide having at least one aperture therein for radiating said energy, supply means for supplying microwave energy to said linear radiator at one end thereof, receiver means for receiving a portion of said microwave energy at the other end of said linear radiator, a first detecting means for detecting a change in the value of energy supplied to said linear radiator at said one end, a second detecting means associated with said receiver means for detecting a change in the value of energy received at said other end of the linear radiator, means for recurrently changing the value of energy supplied to said linear radiator, and checking means for detecting the recurrent response of said first and said second detecting means.

4. In a system for detecting the intrusion of objects into a protected space, in combination, a linear radiator for electromagnetic energy in the microwave spectrum coextensive with the space to be protected and arranged to radiate electromagnetic energy in a pattern to include said protected space, said linear radiator comprising a wave guide having at least one aperture therein for radiating said energy, a continuously energized source of microwave energy connected at one end of said wave guide to supply microwave energy to said wave guide, a shorting relay interposed between said source of microwave energy and said wave guide, said shorting relay comprising means for recurrently changing the value of energy supplied from said source to said wave guide to thereby periodically decrease the value of energy supplied to said wave guide and to increase the load on said oscilaltor, receiving means connected to the end of said wave guide opposite said source of microwave energy for receiving a portion of said microwave energy, a first detecting means associated with said source of microwave energy for detecting a change in the value of energy supplied from said source, a second detecting means associated with said receiving means for detecting a change in the value of energy received by said receiving means, and checking means for detecting the recurrent response of said first and said second detecting means.

PAUL M. BRANNEN.

REFERENCES CITED

The following references are of record in the file of this patent:

UNITED STATES PATENTS

| Number | Name | Date |
|---|---|---|
| 2,197,028 | Wolff | Apr. 16, 1940 |
| 2,206,923 | Southworth | July 9, 1940 |
| 2,247,246 | Lindsey et al. | June 24, 1941 |
| 2,403,955 | Schlesinger | July 16, 1946 |
| 2,454,687 | Baughman | Nov. 23, 1948 |
| 2,455,940 | Muskat et al. | Dec. 14, 1948 |
| 2,455,942 | Coggeshall et al. | Dec. 14, 1948 |